(12) United States Patent
Kawabata

(10) Patent No.: US 9,466,519 B2
(45) Date of Patent: Oct. 11, 2016

(54) DE-CHUCK CONTROL METHOD AND CONTROL DEVICE FOR PLASMA PROCESSING APPARATUS

(71) Applicant: Tokyo Electron Limited, Tokyo (JP)

(72) Inventor: Atsushi Kawabata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 14/367,305

(22) PCT Filed: Jan. 25, 2013

(86) PCT No.: PCT/JP2013/051654
§ 371 (c)(1),
(2) Date: Jun. 20, 2014

(87) PCT Pub. No.: WO2013/115110
PCT Pub. Date: Aug. 8, 2013

(65) Prior Publication Data
US 2015/0303092 A1      Oct. 22, 2015

Related U.S. Application Data

(60) Provisional application No. 61/595,729, filed on Feb. 7, 2012.

(30) Foreign Application Priority Data

Feb. 3, 2012      (JP) .................................. 2012-021658

(51) Int. Cl.
| | | |
|---|---|---|
| H01L 21/683 | (2006.01) | |
| G01R 19/25 | (2006.01) | |
| H02N 13/00 | (2006.01) | |

(52) U.S. Cl.
CPC ........... *H01L 21/6833* (2013.01); *G01R 19/25* (2013.01); *H02N 13/00* (2013.01)

(58) Field of Classification Search
CPC ... H01L 21/6833; H04N 13/00; G01R 19/25
See application file for complete search history.

(56) References Cited

U.S. PATENT DOCUMENTS

| | | | |
|---|---|---|---|
| 2009/0308537 A1* | 12/2009 | Shibuya ................. | C23C 14/50 156/345.35 |
| 2010/0271744 A1* | 10/2010 | Ni ....................... | H01L 21/6833 361/233 |
| 2012/0097332 A1* | 4/2012 | Lin .................... | H01J 37/32532 156/345.54 |

FOREIGN PATENT DOCUMENTS

| | | |
|---|---|---|
| JP | H11-260897 | 9/1999 |
| JP | 2003-347395 | 12/2003 |
| JP | 2007-242913 | 9/2007 |
| JP | 2011-040658 | 2/2011 |

\* cited by examiner

*Primary Examiner* — Thienvu Tran
*Assistant Examiner* — Tien Mai
(74) *Attorney, Agent, or Firm* — IPUSA, PLLC

(57) ABSTRACT

A de-chuck control method is provided for de-chucking a workpiece from an electrostatic chuck, which includes a chuck electrode and electrostatically attracts the workpiece. The de-chuck control method includes acquiring a time-integration value of a current by measuring the current flowing from the chuck electrode for a predetermined time period after a plasma process is ended and a voltage applied to the chuck electrode is turned off; calculating a difference between the time-integration value of the current and an electric charge charged to the chuck electrode during the plasma process; calculating a counter voltage according to a residual charge of the electrostatic chuck based on the difference and a predetermined correlation between the time-integration value of the current and a torque acting on a support pin for supporting the workpiece; and applying the counter voltage to the chuck electrode while introducing gas into a processing chamber and generating plasma.

9 Claims, 10 Drawing Sheets

DE-CHUCK CONTROL METHOD AND CONTROL DEVICE FOR PLASMA PROCESSING APPARATUS

CROSS-REFERENCE TO RELATED APPLICATIONS

The present application is a National Stage of International Application No. PCT/JP2013/051654 filed on Jan. 25, 2013, claiming priority based on Japanese Patent Application No. 2012-021658 filed on Feb. 3, 2012, and U.S. Provisional Application No. 61/595,729 filed on Feb. 7, 2012, the entire contents of which are hereby incorporated by reference.

TECHNICAL FIELD

The present invention relates to a de-chuck control method and a control device for a plasma processing apparatus.

BACKGROUND ART

A plasma process is often performed under a vacuum atmosphere by vacuuming gas from a processing chamber. In such case, a workpiece is placed on a an electrostatic chuck (ESC) that is arranged on a mounting table within the processing chamber.

The electrostatic chuck includes a chuck electrode made of a conductive sheet and dielectric members arranged at the front surface and backside surface of the chuck electrode. In the case of performing a plasma process, a workpiece such as a wafer is electrostatically attracted to the electrostatic chuck by a Coulomb force that is generated when a voltage from a DC voltage supply is applied to the electrostatic chuck, and the plasma process is performed in such a state. Also, a heat transfer gas is supplied between a backside surface of the wafer and the front surface of the electrostatic chuck. In the case of de-chucking the workpiece from the electrostatic chuck after the plasma process is ended and the voltage applied to the electrostatic chuck is turned off, inert gas is introduced into the processing chamber and the pressure within the processing chamber is maintained at a predetermined pressure. In this state, an opposite polarity voltage of the voltage applied to the electrostatic chuck during the plasma process is applied to the electrostatic chuck, and the opposite polarity voltage is turned off thereafter. In this way, a discharge process is performed for discharging (removing) electric charges in the electrostatic chuck and the workpiece. Then, support pins are raised to lift the workpiece from the electrostatic chuck and de-chuck the workpiece from the electrostatic chuck.

However, the front surface and the backside surface of the electrostatic chuck change over time. For example, substances such as reaction products generated during a plasma process adhere to and gradually accumulate on the front surface of the electrostatic chuck to form an insulating film. The accumulated substances are easily charged and tend to retain the electric charge. Accordingly, the electric potential of the front surface of the electrostatic chuck may change over time. In turn, the attraction force of the electrostatic chuck may change as a result of the accumulated substances. That is, an electric charge may be accumulated within the insulating film formed on the front surface of the electrostatic chuck, and a residual charge may remain on the surface layer of the electrostatic chuck even when the voltage applied to the electrostatic chuck is turned off. The residual charge may not be removed even when the above discharge process is performed. Thus, an electrostatic attraction force from the residual charge may remain when the support pins are lifted, and as a result, the workpiece may be damaged and/or normal loading operations of the workpiece may be hampered, for example.

In this respect, Patent Document 1 discloses a technique for pre-emptively avoiding a situation in which a workpiece such as a wafer is prevented from being de-chucked from the electrostatic chuck owing to such a residual charge. The technique involves detecting the state of the residual charge attracting the wafer upon turning off the voltage applied to the electrostatic chuck from the DC voltage supply and lifting the wafer from the electrostatic chuck, and determining a replacement timing for replacing the electrostatic chuck based on the detection result. In Patent Document 1, the state of the residual charge on the electrostatic chuck is detected based on the torque or rotation speed of a drive motor for lifting the support pins supporting the wafer.

PRIOR ART DOCUMENTS

Patent Documents

Patent Document 1: Japanese Laid-Open Patent Publication No. H11-260897

SUMMARY OF THE INVENTION

Problem to be Solved by the Invention

However, in Patent Document 1, the state of the residual charge on the electrostatic chuck is detected from a thrust load (torque of the drive motor) applied when thrusting the workpiece (wafer) from the electrostatic chuck with a thrust mechanism, and the detection is based on the premise that the thrust load (torque of the drive motor) and the attraction force of the electrostatic chuck bear a proportional relationship. Also, the wafer is distorted while the wafer is being lifted by the support pins. In Patent Document 1, measures are implemented to interrupt the movement of the support pins, and as a result, the wafer may be prone to damage. Further, because the technique disclosed in Patent Document 1 involves repeatedly alternating between thrusting the workpiece according to the torque and stopping the thrusting operation, a significant amount of time is required and throughput may be degraded as a result. Therefore, actual implementation of the technique may not be practicable.

One aspect of the present invention relates to providing a de-chuck control method and a control device for a plasma processing apparatus that enable de-chucking a workpiece from an electrostatic chuck through voltage control of a DC voltage supply.

Means for Solving the Problem

According to one embodiment of the present invention, a de-chuck control method is provided for de-chucking a workpiece from an electrostatic chuck, which includes a chuck electrode and is configured to electrostatically attract the workpiece. The de-chuck control method includes the steps of acquiring a time-integration value of a current based on a result of measuring the current flowing from the chuck electrode for a predetermined time period after a plasma process on the workpiece is ended and a voltage applied to the chuck electrode during the plasma process is turned off; calculating a difference between the acquired time-integration value of the current and a predetermined electric charge that is charged to the chuck electrode when the voltage is applied to the chuck electrode during the plasma process; calculating a counter voltage according to a residual charge of the electrostatic chuck based on the calculated difference; applying the counter voltage to the chuck electrode; and raising a support pin for supporting the workpiece and de-chucking the workpiece from the electrostatic chuck after the counter voltage is applied to the chuck electrode, and turning off the counter voltage.

According to another embodiment of the present invention, a control device is provided for a plasma processing apparatus including an electrostatic chuck, which includes a chuck electrode and is configured to electrostatically attract a workpiece. The control device includes an acquisition unit configured to acquire a time-integration value of a current based on a result of measuring for a predetermined time period the current that flows from the electrostatic chuck after a plasma process on the workpiece is ended and a voltage applied to the workpiece during the plasma process is turned off; and a control unit configured to calculate a difference between the acquired time-integration value of the current and a predetermined electric charge that is charged to the electrostatic chuck when the voltage is applied to the chuck electrode during the plasma process, calculate a counter voltage according to a residual charge of the electrostatic chuck based on the calculated difference, apply the counter voltage to the chuck electrode, raise a support pin for supporting the workpiece and de-chuck the workpiece from the electrostatic chuck after the counter voltage is applied to the chuck electrode, and turn off the counter voltage.

Advantageous Effect of the Invention

According to an aspect of the present invention, a de-chuck control method and a control device for a plasma processing apparatus may be provided that enable de-chucking of a workpiece from an electrostatic chuck through voltage control of a DC voltage supply.

EMBODIMENTS FOR IMPLEMENTING THE INVENTION

Figure 1:
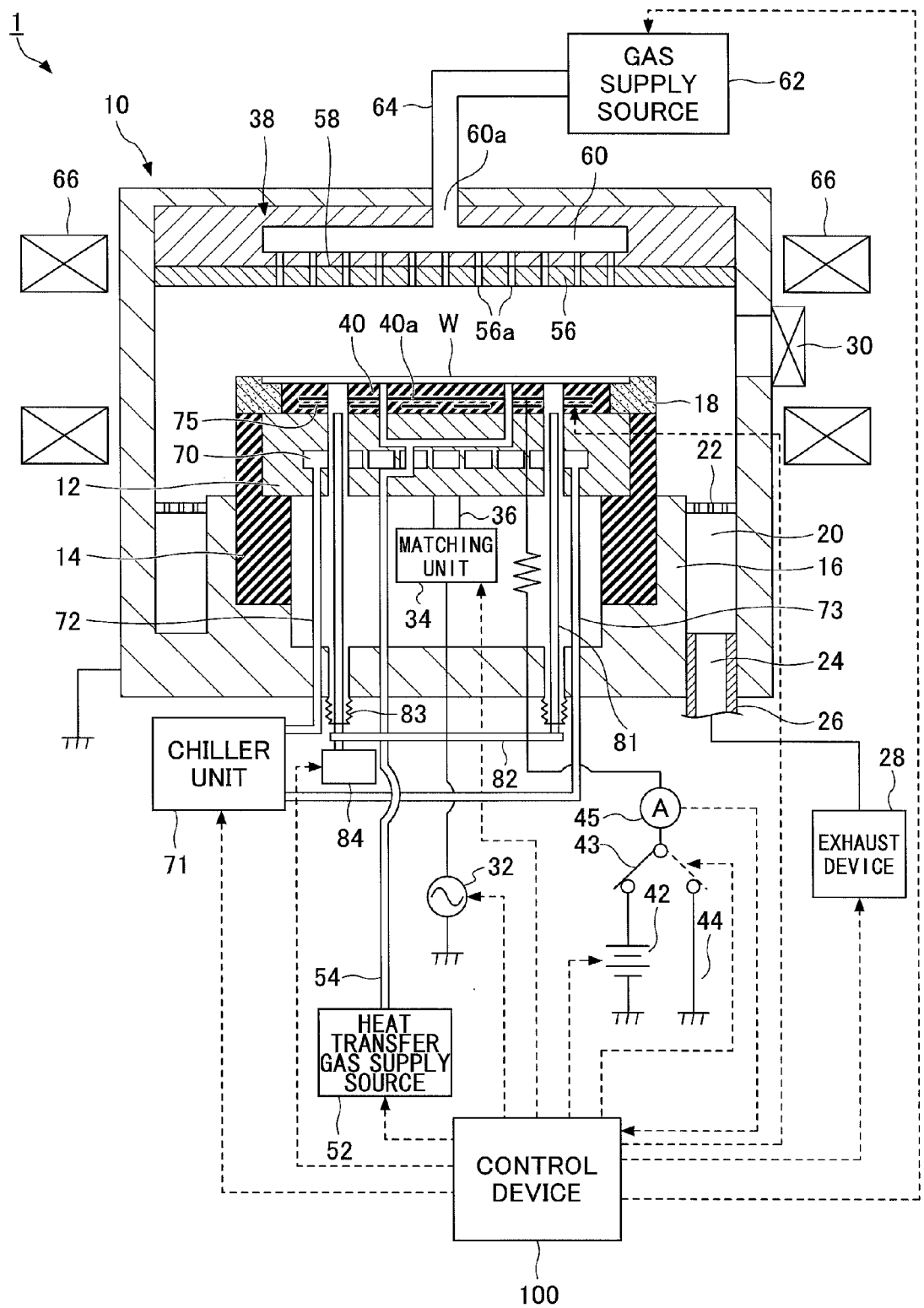
FIG. 1 illustrates an overall configuration of a plasma processing apparatus according to an embodiment of the present invention.

In the following, embodiments of the present invention are described with reference to the accompanying drawings. Note that elements having substantially the same functions or features may be given the same reference numerals and overlapping descriptions thereof may be omitted.

In the case of performing a plasma process, a workpiece such as a wafer is electrostatically attracted to the electrostatic chuck by a Coulomb force that is generated when a voltage from a DC voltage supply is applied to the electrostatic chuck, and the plasma process is performed in such a state. In this case, a heat transfer gas is supplied between a backside surface of the wafer and a front surface of the electrostatic chuck. In the case of de-chucking the workpiece from the electrostatic chuck after the plasma process is ended and the voltage applied to the electrostatic chuck is turned off, an inert gas such as $N_2$ gas or Ar gas is introduced into the processing chamber and the pressure within the processing chamber is maintained at a predetermined pressure (e.g. 100-400 mTorr). In this state, an opposite polarity voltage of the voltage applied to the electrostatic chuck during the plasma process is applied to the electrostatic chuck, and the opposite polarity voltage is turned off thereafter. In this process, electric charges in the electrostatic chuck and the workpiece are discharged (removed). In some discharge processes, a high frequency power from a high frequency power supply may be supplied to the processing chamber to generate plasma while the opposite polarity voltage is applied to the electrostatic chuck. Typically, the voltage applied to the electrostatic chuck is turned off after the discharge process. Then, support pins are raised to lift the workpiece from the electrostatic chuck and de-chuck the workpiece from the electrostatic chuck.

However, the front surface and the backside surface of the electrostatic chuck change over time. For example, substances such as reaction products generated during a plasma process adhere to and gradually accumulate on the front surface of the electrostatic chuck to form an insulating film. The accumulated substances are easily charged and tend to retain the electric charge. Accordingly, the electric potential of the front surface of the electrostatic chuck may change over time. In turn, the attraction force of the electrostatic chuck may change as a result of the accumulated substances. That is, an electric charge may be accumulated within the insulating film formed on the front surface of the electrostatic chuck, and a residual charge may remain on the surface layer of the electrostatic chuck even when the voltage applied to the electrostatic chuck is turned off. The residual charge may not be removed even when the above discharge process is performed. Thus, an electrostatic attraction force from the residual charge may remain when the support pins are lifted, and as a result, the workpiece may be damaged or normal loading operations of the workpiece may be hampered, for example.

In light of the above, measures such as polishing the surface layer of the electrostatic chuck or cleaning the interior of the processing chamber may be contemplated to remove the substances accumulated on the surface of the electrostatic chuck. However, in some cases, the accumulated substances may not be completely removed even if such measures are implemented. Moreover, even if the accumulated substances can be removed, because the above measures require exposing the processing chamber to the atmosphere and removing the electrostatic chuck from the processing chamber, the apparatus availability may be substantially decreased. Accordingly, there is a demand for a technique for electrically de-chucking from an electrostatic chuck a workpiece that is attracted to the electrostatic chuck by a residual charge before the workpiece cracks, for example.

Note that in an electrostatic chuck that has dielectric members with a volume resistivity of $1 \times 10^{12-14}$ Ωcm formed by thermal spraying, a wafer may be de-chucked by a conventional wafer de-chucking method using a discharge process. However, in a Coulomb-type electrostatic chuck having a volume resistivity of at least $1 \times 10^{14}$ Ωcm, electric charges are less likely to escape from the surface layer of the electrostatic chuck. Thus, the electric charges remain within the electrostatic chuck thereby making it increasingly difficult to de-chuck the wafer from the electrostatic chuck by merely performing a discharge process.

Also, in recent years, a mechanism for performing high speed temperature adjustment of a surface temperature of the electrostatic chuck using a heater (referred to as "heater-embedded electrostatic chuck mechanism" hereinafter) is being used. In the heater-embedded electrostatic chuck mechanism, a member having a relatively high volume resistivity of at least $1 \times 10^{14}$ Ωcm is used in the electrostatic chuck. That is, the heater-embedded electrostatic chuck mechanism uses a Coulomb-type electrostatic chuck that is dominated by an electrostatic attraction force. Thus, electric charges are more likely to remain within the surface layer of the electrostatic chuck thereby making it increasingly difficult to de-chuck from the electrostatic chuck a wafer that has been attracted to the electrostatic chuck by the residual charge by merely performing a discharge process. Accordingly, as the use of the heater-embedded electrostatic chuck mechanism becomes more common, the above problems with regard to the accumulation of reaction products on the electrostatic chuck surface that results in the residual charge and the difficulty of de-chucking a workpiece due to a residual attraction force produced by the residual charge become more noticeable.

The following descriptions of certain embodiments of the present invention relate to a de-chuck control method for de-chucking a workpiece from an electrostatic chuck that may be implemented even in a case where the heater-embedded electrostatic chuck mechanism is used and a plasma processing apparatus including a control device that is configured to execute such de-chuck control method.

[Overall Configuration of Plasma Processing Apparatus]

First, an overall configuration of a plasma processing apparatus according to an embodiment of the present invention is described with reference to FIG. 1.

The plasma processing apparatus 1 illustrated in FIG. 1 is configured as a RIE (Reactive Ion Etching) plasma processing apparatus. The plasma processing apparatus 1 includes a cylindrical chamber (processing chamber 10) made of a metal such as aluminum or stainless steel, for example. The processing chamber 10 is grounded. A plasma process such as an etching process may be performed on a workpiece within the processing chamber 10.

A mounting table 12 configured to hold a semiconductor wafer W (hereinafter, simply referred to as a "wafer W") thereon as the workpiece is arranged within the processing chamber 10. The mounting table 12 may be made of aluminum, for example, and is supported on a cylindrical support 16 via an insulating cylindrical holder 14. The cylindrical support 16 extends vertically upward from a bottom of the processing chamber 10. A focus ring 18 that may be made of quartz, for example, is disposed on a top surface of the cylindrical holder 14 to surround a top surface edge of the mounting table 12.

An exhaust path 20 is formed between a sidewall of the processing chamber 10 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the processing chamber 10 to a predetermined vacuum level. A gate valve 30 configured to open/close an entry/exit port for the wafer W is provided at the sidewall of the processing chamber 10.

A high frequency power supply 32 for plasma generation is electrically connected to the mounting table 12 via a matching unit 34 and a power feed rod 36. The high frequency power supply 32 is configured to apply a high frequency power of 60 MHz, for example, to the mounting table 12. In this way, the mounting table 12 also acts as a lower electrode. Further, a shower head 38, which is described below, is provided at a ceiling portion of the processing chamber 10. The shower head 38 acts as an upper electrode of a ground potential. In this way, a high frequency voltage from the high frequency power supply 32 is capacitatively applied between the mounting table 12 and the shower head 38.

An electrostatic chuck 40 configured to hold the wafer W by an electrostatic attractive force is provided on the top surface of the mounting table 12. The electrostatic chuck 40 includes a chuck electrode 40a that is made of a conductive film and is arranged between a pair of insulating films or insulating sheets. A DC voltage supply 42 is electrically connected to the chuck electrode 40a via a switch 43. The electrostatic chuck 40 electrostatically attracts and holds the wafer W by a Coulomb force that is generated upon applying (turning on) a DC voltage from the DC voltage supply 42 to the chuck electrode 40a.

In the case of turning off the voltage applied to the chuck electrode 40a, the switch 43 is connected to a ground part 44. Note that in the following descriptions, turning off the voltage applied to the electrostatic chuck electrode 40a refers to grounding the chuck electrode 40a.

An ammeter 45 is arranged between the chuck electrode 40a and the DC voltage supply 42. The ammeter 45 may measure the current that flows from the chuck electrode 40a when the voltage for attracting the wafer W is applied to the chuck electrode 40a during a plasma process to acquire a time-integration value of the current. Alternatively, the ammeter 45 may measure the current that flows when the voltage is turned off after the plasma process is ended to acquire the time-integration value of the current.

A heat transfer gas supply source 52 is configured to supply a heat transfer gas such as He gas or Ar gas to the backside surface of the wafer W placed on the electrostatic chuck 40 through a gas supply line 54. The shower head 38 disposed at the ceiling portion of the processing chamber 10 includes an electrode plate 56 having multiple gas holes 56a and an electrode supporting body 58 configured to detachably hold the electrode plate 56. A buffer chamber 60 is formed within the electrode supporting body 58. A gas inlet 60a of the buffer chamber 60 is connected to a gas supply line 64, which is connected to a gas supply source 62. In this way, desired gas may be supplied to the processing chamber 10 from the gas supply source 62.

A plurality of support pins 81 (e.g. three) for lifting the wafer W and passing the wafer to/from an external transfer arm (not shown) are arranged within the mounting table 12. The support pins 18 are moved up and down by the power of a motor 84 transmitted via a link member 82. Bellows 83 are arranged at through holes for the support pins 81. The support pins 81 penetrate through the processing chamber 10 toward the exterior via the through holes. The bellows 83 are configured to maintain airtightness between the interior of the processing chamber 10, which is under a vacuum, and the external atmosphere.

A magnet 66 is arranged to extend annularly or concentrically around the processing chamber 10. An RF electric field may be formed in a plasma generating space between the shower head 38 and the mounting table 12 within the processing chamber 10 along a vertical direction by the high frequency power supply 32, and high-density plasma may be generated around the front surface of the wafer W.

A coolant path 70 is formed within the mounting table 12. A coolant cooled to a predetermined temperature is supplied to and circulated within the coolant path 70 from a chiller unit 71 via pipes 72 and 73. Also, a heater 75 is embedded within the electrostatic chuck 40. A desired AC voltage is supplied to the heater 75 from a AC power supply (not shown). In this way, the processing temperature for processing the wafer W placed on the electrostatic chuck 40 may be adjusted to a desired temperature though cooling by the chiller unit 71 and heating by the heater 75. Note that in some embodiments, the heater 75 does not have to be provided. In other embodiments, the heater 75 may be adhered to a lower side surface of the electrostatic chuck 40 using an adhesive layer, for example.

A control device 100 is configured to control the individual components of the plasma processing apparatus 1 such as the gas supply source 62, the exhaust device 28, the heater 75, the DC voltage supply 42, the switch 43, the matching unit 43, the high frequency power supply 32, the heat transfer gas supply source 52, the motor 84, and the chiller unit 71. The control device 100 also acquires the current value and the time-integration value of the current detected by the ammeter 45 as needed. The control device 100 may be connected to a host computer (not shown), for example.

The control device 100 includes a CPU (Central Processing Unit), a ROM (Read Only Memory), and a RAM (Random Access Memory), which are not shown. The CPU executes a plasma process according to various recipes stored in a storage area of the above memory. The recipes include apparatus control information according to process conditions, such as processing time, temperatures within the processing chamber (upper electrode temperature, side wall temperature of the processing chamber, lower electrode temperature, etc.), pressure (gas exhaust), high frequency power to be applied, voltage to be applied to the chuck electrode 40a, flow rates of various processing gases, and the flow rate of the heat transfer gas, for example.

When performing an etching process using the plasma processing apparatus 1 having the above-described configuration, first, the gate valve 30 is opened, and the wafer W is loaded into the processing chamber 10 while being held by a transfer arm. Then, the wafer W is lifted from the transfer arm by the support pins 81 protruding from the front surface of the electrostatic chuck 40 protruding from the surface of the electrostatic chuck 40, and the wafer W is held on the support pins 81. Then, after the transfer arm exits the processing chamber 10, the support pins 81 are lowered into the electrostatic chuck 40 so that the wafer W may be placed on the electrostatic chuck 40.

After the wafer W is loaded, the gate valve 30 is closed. Then, an etching gas is introduced into the processing chamber 10 from the gas supply source 62 at a predetermined flow rate, and the internal pressure of the processing chamber 10 is reduced to a predetermined pressure by the exhaust device 28 and stabilized at this pressure. Further, a high frequency power of a certain power level is applied to the mounting table 12 from the high frequency power supply 32. Also, a DC voltage from the DC voltage supply 42 is applied to the chuck electrode 40a so that the wafer W may be fixed to the electrostatic chuck 40. The heat transfer gas supply source 52 supplies a heat transfer gas such as He gas or Ar gas to the backside surface of the wafer W that is placed on the electrostatic chuck 40 via the gas supply line 54. The etching gas sprayed into the processing chamber 10 from the shower head 38 is excited into plasma by the high frequency power from the high frequency power supply 32. As a result, plasma is generated within a plasma generating space between the upper electrode (shower head 38) and the lower electrode (mounting table 12). A main surface of the wafer W is etched by radicals and ions contained in the generated plasma.

After plasma etching is completed and the wafer W is to be de-chucked from the electrostatic chuck 40, the supply of the heat transfer gas is turned off, and the voltage applied to the chuck electrode 40a is turned off. Then, an inert gas is introduced into the processing chamber 10 and the pressure within the processing chamber 10 is maintained at a predetermined pressure. In this state, an opposite polarity voltage of the voltage applied to the chuck electrode 40a during the plasma process (etching process) is applied to the chuck electrode 40a and the opposite voltage is turned off thereafter. In this way, a discharge process is performed for discharging (removing) electric charges in the electrostatic chuck 40 and the wafer W. In this state, the support pins 81 are raised to lift the wafer W from the electrostatic chuck 40. After the gate valve 30 is opened and the transfer arm is introduced into the processing chamber 10, the support pins 81 are lowered and the wafer W is held on the transfer arm. Subsequently, the transfer arm exits the processing chamber 10, and a next wafer W is loaded into the processing chamber 10 by the transfer arm. By repeating the above-described process, wafers W may be successively processed. An overall configuration of the plasma processing apparatus according to an embodiment of the present invention has been described above.

[Counter Voltage Principle]

Figure 2:
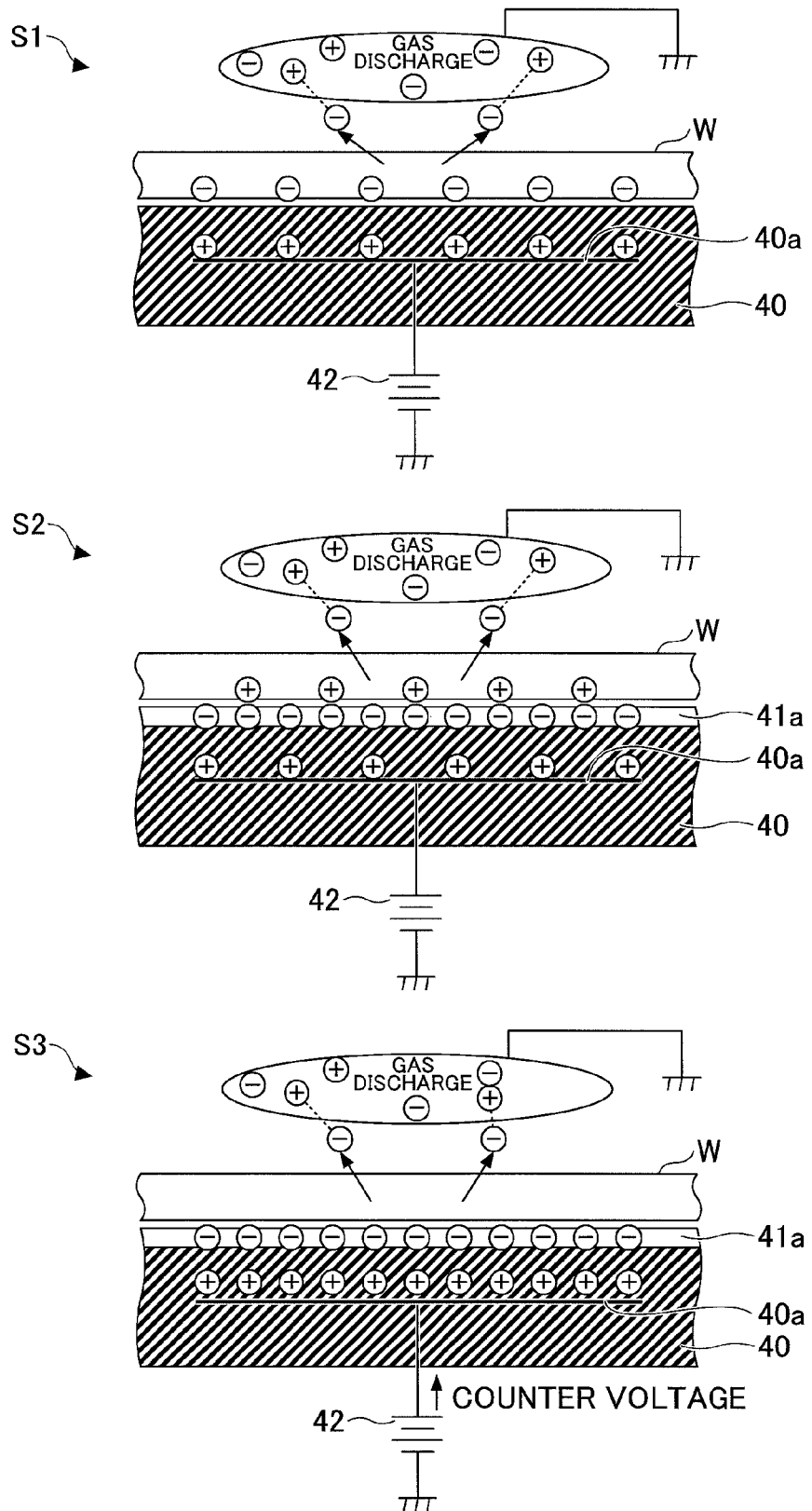
FIG. 2 illustrates a principle of a counter voltage used in a de-chuck control method according to an embodiment of the present invention.
Figure 3:
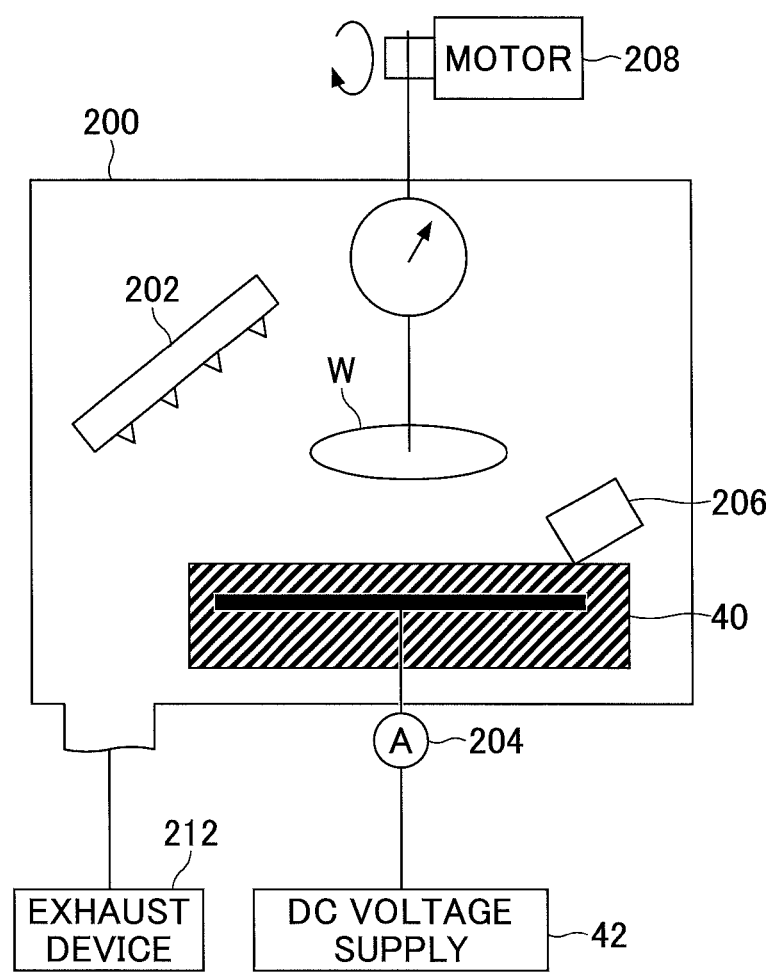
FIG. 3 illustrates a measuring device according to an embodiment of the present invention.

Next, a principle of a counter voltage used in a wafer de-chuck control method according to an embodiment of the present invention is described with reference to FIG. 2. Note that "S1" of FIG. 2 illustrates a state of the electrostatic chuck 40 before an insulating film is formed, "S2" of FIG. 2 illustrates a state of the electrostatic chuck 40 after an insulating film is formed thereon such that a wafer W is attracted to the electrostatic chuck 40 by a residual charge, and "S3" of FIG. 3 illustrates a state of the electrostatic chuck 40 when a counter voltage is applied thereto.

For example, when a voltage of 2.5 kW from the DC voltage supply 42 is applied to the chuck electrode 40a, an electric charge (positive charge in the present example) is charged to the chuck electrode 40a. When no substances are accumulated on the surface layer of the chuck electrode 40a and the insulating layer is not yet formed as illustrated in "S1" of FIG. 2, the wafer W is charged with a negative charge corresponding to the positive charge in the chuck electrode 40a due to gas discharge of gas within the processing chamber 10. In this way, the wafer W is electrostatically attracted to the electrostatic chuck 40. In the case of de-chucking the wafer W, first, the output of the DC voltage supply 42 is set to 0 kW, and the chuck electrode 40a is connected to the ground part 44 by the switch 43 illustrated in FIG. 1. In this way, the charge in the chuck electrode 40a may be discharged. Also, the charge in the wafer W may be discharged through gas discharge of gas within the processing chamber 10. In this way, the potential difference between the wafer W and the electrostatic chuck 40 may be eliminated and the wafer W may be de-chucked from the electrostatic chuck 40.

However, deposits from plasma damage and reaction products generated during a plasma process gradually accumulate on the surface layer of the electrostatic chuck 40 to thereby form an insulating film 41a on the electrostatic chuck 40. As the insulating film 41a gets thicker as illustrated in "S2" and "S3" of FIG. 2, an electric charge may be accumulated within the insulating film 41a. For example, "S2" of FIG. 2 illustrates a case where a negative charge is accumulated in the insulating film 41a.

In such a state, a part of the charge of the insulating film 41a is attracted to the positive charge of the wafer W and another part of the charge of the insulating film 41a is attracted to the positive charge of the electrostatic chuck 40 such that a balanced state is created as a whole. In this case, the wafer W is attracted to the electrostatic chuck 40 by the residual charge. Note that a positive charge also remains within the chuck electrode 40a. The positive charge remaining within the chuck electrode 40a corresponds to the electric charge accumulated in the chuck electrode 40a when the voltage is applied to the chuck electrode 40a that remains within the chuck electrode 40a to balance out a part of the residual charge. The charge of the chuck electrode 40a increases in proportion to the total residual charge. In this state, the backside surface and the front surface of the wafer are polarized.

Accordingly, a residual attraction force is generated between the wafer W and the surface of the electrostatic chuck 40. As a result, the wafer may not be de-chucked from the electrostatic chuck 40 even when the support pins 81 are raised, and in some cases, the wafer W may be damaged by the support pins 81. Moreover, the charge on the surface of the electrostatic chuck 40 may not be removed by a normal discharge process.

In light of the above, in the present embodiment, a counter voltage is applied to the chuck electrode 40a to prevent a residual attraction force from being generated between the wafer W and the electrostatic chuck 40 surface. As illustrated in "S3" of FIG. 2, a counter voltage refers to a voltage that is applied to the chuck electrode 40a from the DC voltage supply 42 so as to prompt gas discharge and control the electric charge of the electrostatic chuck 40 surface to be zero by balancing out a negative charge corresponding to the total amount of residual charge with a positive charge of the chuck electrode 40a. In this state, the backside surface and the front surface of the wafer W are not polarized. Thus, the residual attraction force between the wafer W and the electrostatic chuck 40 surface may be reduced to zero, the potential difference between the wafer W and the electrostatic chuck 40 may be eliminated, and the wafer W may be de-chucked from the electrostatic chuck 40.

Note that in the example described above, it is assumed that a negative charge is accumulated in the insulating film 41a. However, this is merely an illustrative example, and in other examples, a positive charge may be accumulated in the insulating film 41a, or both positive and negative charges may be accumulated in the insulating film 41a.

[Counter Voltage Determination Method]

Next, a method of determining the counter voltage to be used in the wafer de-chuck control method according to the present embodiment is described. As described above in connection with the principle of the counter voltage, a positive charge is accumulated in the chuck electrode 40a in proportion to the total amount of negative residual charge accumulated in the insulating film 41a to balance out the residual charge.

In a case where the electrostatic chuck 40 is free of residual charge, a time-integration value Qon of a current that flows for a predetermined time period when a predetermined voltage $V_1$ for attracting the wafer W placed on the electrostatic chuck 40 is applied to the chuck electrode 40a is equal to a time-integration value Qoff of a current that flows for a predetermined time period when the voltage is $V_1$ turned off as indicated by the following formula (1).

$$Q\text{on} = Q\text{off} \tag{1}$$

Note that because the voltage $V_1$ is known, the capacitance Co between the wafer W and the chuck electrode 40a may be obtained by the following formula (2).

$$Co = Q\text{on}/V_1 \tag{2}$$

In the case where a residual charge resides within the electrostatic chuck 40, a charge for balancing out the residual charge remains within the chuck electrode 40a even after the voltage applied to the chuck electrode 40a is turned off. Thus, a time-integration value Q'off of a current that flows for a predetermined time when the voltage is turned off in this case is reduced accordingly. A difference between the time-integration value Q'off and the time-integration value Qoff may be obtained by calculating the following formula (3). The calculated value corresponds to a difference charge ΔQ that is charged to the chuck electrode 40a due to the residual charge.

$$\Delta Q = Q\text{on} - Q'\text{off} \tag{3}$$

Because the difference charge ΔQ is proportional to the amount of residual charge, by obtaining the correlation between the difference charge ΔQ and a total amount Q of residual charge beforehand in a counter voltage experiment described below, the capacitance Co obtained by the above formula (2) may be used to determine the counter value $V_c$ as indicated by the following formula (4). That is, the correlation between the difference charge ΔQ and the counter voltage $V_c$ may be obtained.

$$V_c = \text{residual charge total amount } Q/Co = \alpha \Delta Q/Co \text{ (α: constant)} \tag{4}$$

[Counter Voltage Experiment]

Next, an experiment for obtaining the counter voltage $V_c$ based on the correlation between the difference charge ΔQ charged to the chuck electrode 40a by the residual charge and the total amount Q of the residual charge is described with reference to FIG. 3. FIG. 3 illustrates a measuring device 200 according to an embodiment of the present invention.

The measuring device 200 includes an ionizer 202, an ammeter 204, a surface electrometer 206, a motor 208, an exhaust device 212, the electrostatic chuck 40, and the DC voltage supply 42.

In the present experiment, the ionizer 202 charges an electric charge on the electrostatic chuck 40 surface to generate a pseudo residual charge. In this state, the motor 208 is driven and the wafer W is lowered to be placed directly above the electrostatic chuck 40. Also, application of a voltage from the DC voltage supply 42 to the chuck electrode 40a of the electrostatic chuck 40 may be turned on or off. The wafer W is lifted by the motor 208 while the voltage is applied to the chuck electrode 40a and the voltage applied upon de-chucking the wafer W from the electrostatic chuck 40 is monitored. Also, the ammeter 204 arranged between the chuck electrode 40a and the DC voltage supply 42 is used to monitor the time-integration value of a current that flows from the chuck electrode 40a for a predetermined time period when application of the voltage to the chuck electrode 40a is turned on or off. The interior of the measuring device 200 may be depressurized by the exhaust device 212.

While the electrostatic chuck 40 is free of residual charge, application of the voltage $V_1$ to the chuck electrode 40a is turned on and then off, and the time-integration value of the current is monitored. In this way, the time-integration value Qon and the capacitance Co are obtained based on formulas (1) and (2). Then, after a pseudo residual charge of a predetermined total amount Q is generated on the electrostatic chuck 40 surface by the ionizer 202, the wafer W is placed on the electrostatic chuck 40, application of the voltage to the chuck electrode 40a is turned on and then off, the time-integration value Q'off of the current that flows for a predetermined time period after the voltage is turned off is monitored, and the difference charge ΔQ is obtained based on formula (3). Also, the voltage applied to the chuck electrode 40a is gradually changed to a greater value, and operations of lifting the wafer W in accordance with the applied voltage are repeated. The voltage applied when the wafer W is de-chucked from the electrostatic chuck 40 is assumed to be the counter voltage $V_c$ corresponding to the predetermined total amount Q of residual charge. By obtaining the counter voltage $V_c$ corresponding to different predetermined total amounts Q of the residual charge, the correlation between the difference charge ΔQ and the counter voltage $V_c$ (value of α) may be obtained, and formula (4) may be determined. In this way, the correlation between the difference charge ΔQ and the counter voltage $V_c$ may be obtained.

Figure 4:
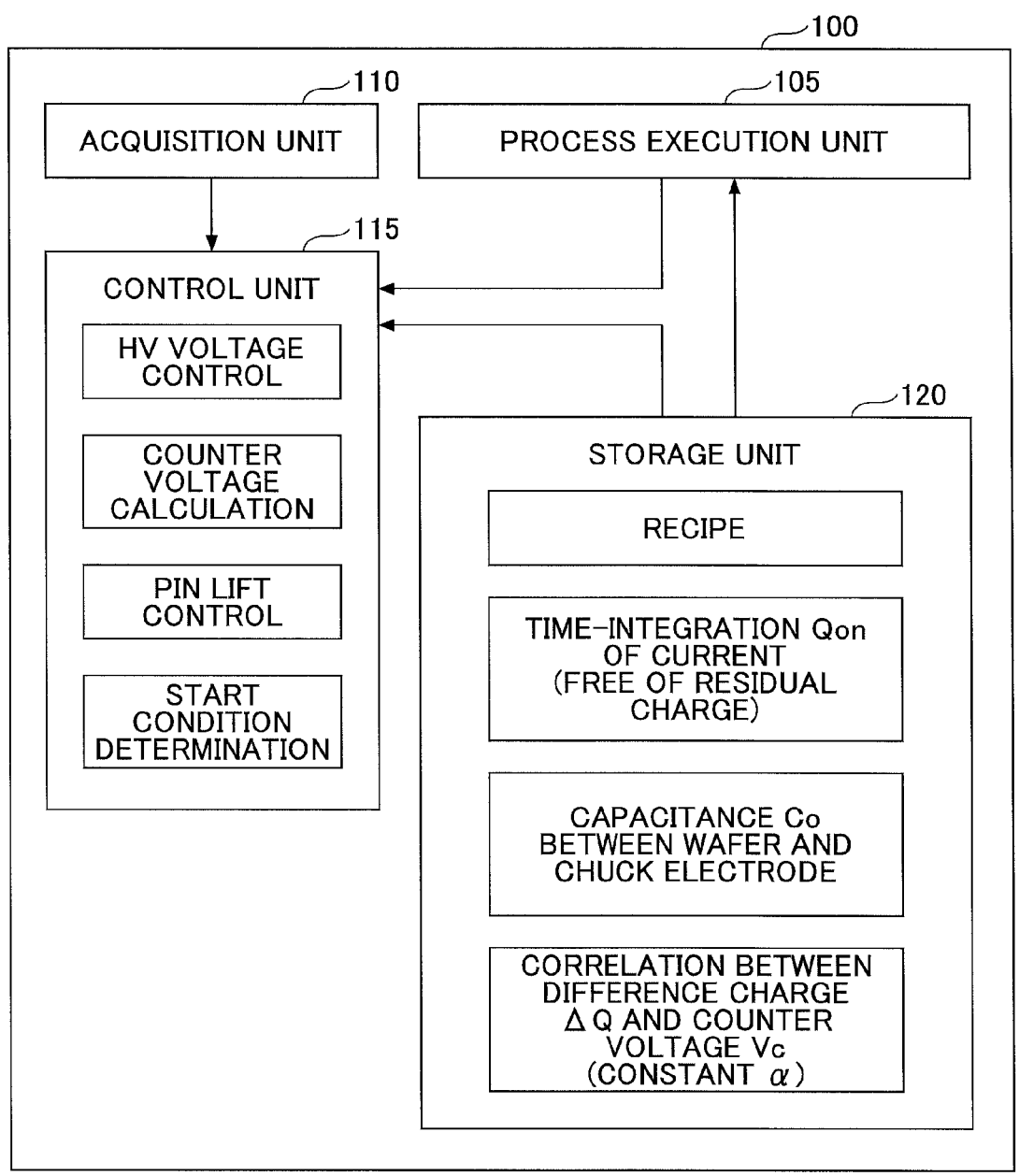
FIG. 4 illustrates a functional configuration of a control device according to an embodiment of the present invention.
Figure 5:
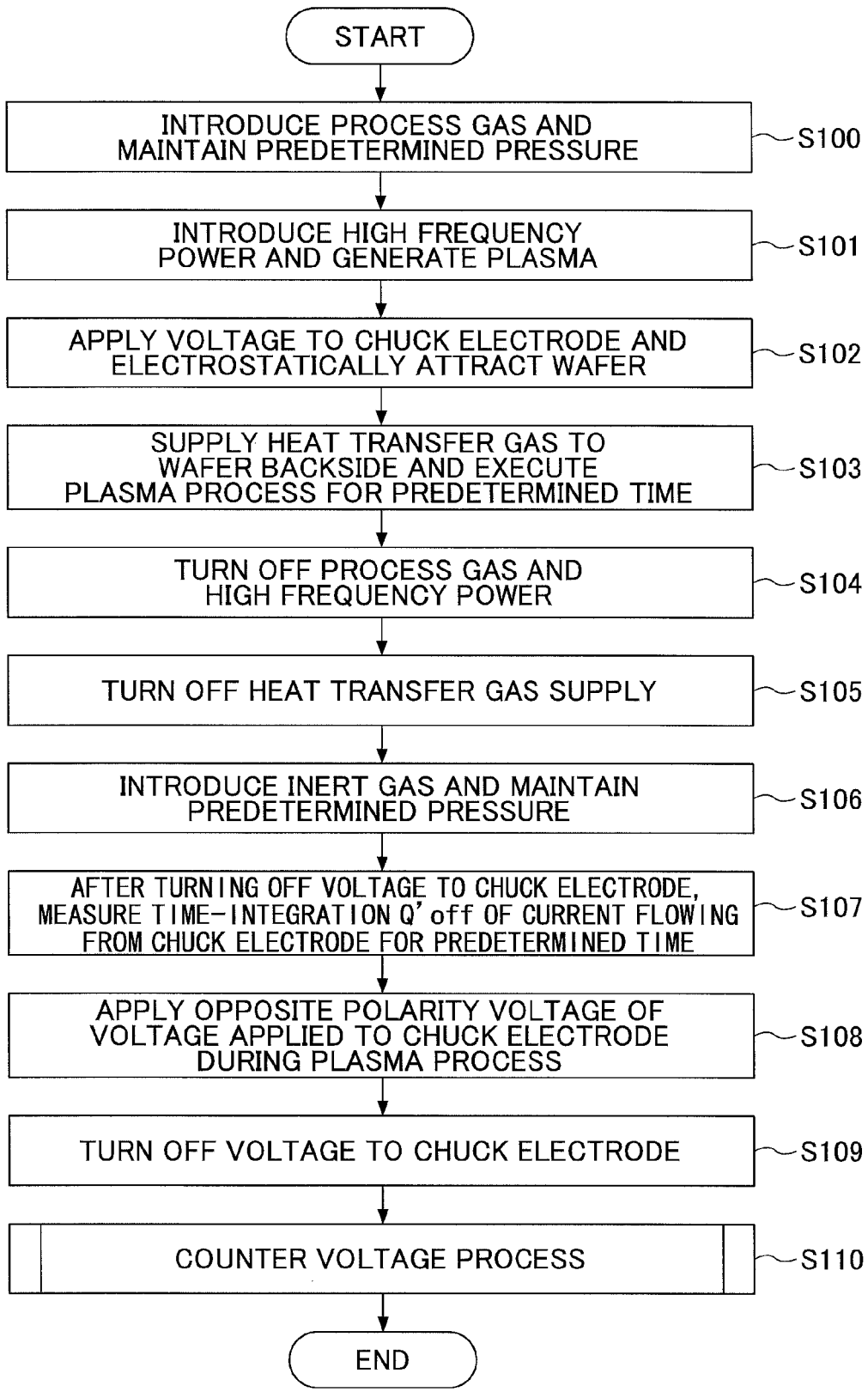
FIG. 5 is a flowchart illustrating process steps for executing the de-chuck control method.

In the above, a wafer de-chuck control method using a counter voltage is illustrated in connection with the principle of the counter voltage, the determination method of the counter voltage, and the counter voltage experiment. In the following, the de-chuck control method for de-chucking the wafer W from the electrostatic chuck 40 using the counter voltage is described in greater detail. Specifically, first, a functional configuration of the control device 100 that executes the de-chuck control method of the present embodiment is described with reference to FIG. 4. Next, operations of the de-chuck control method of the present embodiment are described with reference to FIG. 5. FIG. 4 is a block diagram illustrating the functional configuration of the control device 100 according to the present embodiment. FIG. 5 is a flowchart illustrating process steps of the de-chuck control method according to the present embodiment.

[Control Device Functional Configuration]

The control device 100 controls operations of the plasma processing apparatus 1. Note that the following descriptions relate primarily to functions of the control device 100 for executing the de-chuck control method of the present embodiment for de-chucking the wafer W from the electrostatic chuck 40. The control device 100 as illustrated in FIG. 4 includes a process execution unit 105, an acquisition unit 110, a control unit 115, and a storage unit 120.

The process execution unit 105 selects a desired process recipe from a plurality of recipes stored in the storage unit 120 and executes a process according to the selected process recipe. In the present example, an etching process is executed. The process execution unit 105 may also execute a cleaning process according to a cleaning recipe stored in the storage unit 120.

The acquisition unit 110 acquires a time-integration value Q'off of a current as a measurement result by measuring, for a predetermined time period, the current that flows from the chuck electrode 40a after a voltage applied to the chuck electrode 40a during a plasma process is turned off.

The control unit 115 calculates the counter voltage $V_c$ corresponding to the difference charge ΔQ between the time-integration value Q'off acquired by the acquisition unit 110 and the predetermined time-integration value Qon of the current that flows when the voltage is applied to the chuck electrode 40a while the electrostatic chuck 40 is free of residual charge. The control unit 115 introduces an inert gas into the processing chamber 10 and applies the counter voltage $V_c$ to the chuck electrode 40a. Further, in a de-chuck control operation described below, the control unit 115 may execute processes such as voltage control (HV voltage control) of the voltage from the DC voltage supply 42, calculation of the counter voltage, lift control of the support pins 81, and determination of a start condition of a counter voltage process, for example.

The storage unit 120 stores recipes including a plurality of process recipes for executing an etching process, and a cleaning recipe for executing a cleaning process, for example. The storage unit 120 also stores the time-integration value Qon of the current that flows when the voltage is applied to the chuck electrode 40a while the electrostatic chuck 40 is free of residual charge, the capacitance Co between the wafer W and the chuck electrode 40a, and the correlation between the difference charge ΔQ charged to the chuck electrode 40a by the residual charge and the counter voltage $V_c$. The storage unit 120 may be implemented by a RAM and a ROM using a semiconductor memory, a magnetic disk, or an optical disk, for example. The recipes may be stored in a storage medium and read into the storage unit 120 via a driver (not shown), for example. Alternatively, the recipes may be downloaded to the storage unit 120 via a network (not shown), for example. Also, note that a DSP (digital signal processor) may be used instead of the CPU to implement the various functions of the above components, for example.

Note that the functions of the control device 100 may be implemented by software, hardware, or a combination thereof.

In the above, the functional configuration of the control device 100 that executes the de-chuck control method according to the present embodiment has been described. In the following, operations of the de-chuck control method controlled by the control device 100 using the above functions of the control device 100 are described with reference to FIG. 5.

[Control Device Operations: De-Chuck Control Method]

After a wafer W is loaded into the processing chamber 10 and a plasma process is started, a process gas is introduced into the processing chamber 10 and the pressure within the processing chamber 10 is maintained at a predetermined pressure (step S100). Then, a high frequency power is introduced into the processing chamber 10 to generate plasma (step S101). After the plasma is generated, a voltage is applied to the chuck electrode 40a to prompt the wafer W to be electrostatically attracted to the electrostatic chuck 40

(step S102). Then, a heat transfer gas is supplied between the wafer W backside surface and the electrostatic chuck 40 surface, and the plasma process is performed for a predetermined time in this state (step S103). After the plasma process is completed, the supply of the process gas and the high frequency power is turned off (step S104), the supply of the heat transfer gas is turned off (step S105), an inert gas is introduced into the processing chamber 10, and the pressure within the processing chamber 10 is maintained at a predetermined first pressure (e.g. 100-400 mTorr) (step S106). Then, after turning off the voltage applied to the chuck electrode 40a, the time-integration value Q'off of a current that flows from the chuck electrode 40a is measured for a predetermined time period (step S107).

Then, an opposite polarity voltage of the voltage applied to the chuck electrode 40a during the plasma process is applied to the chuck electrode 40a (step S108), and the opposite polarity voltage is turned off thereafter (step S109). Then, a counter voltage process is performed (step S110).

Figure 6:
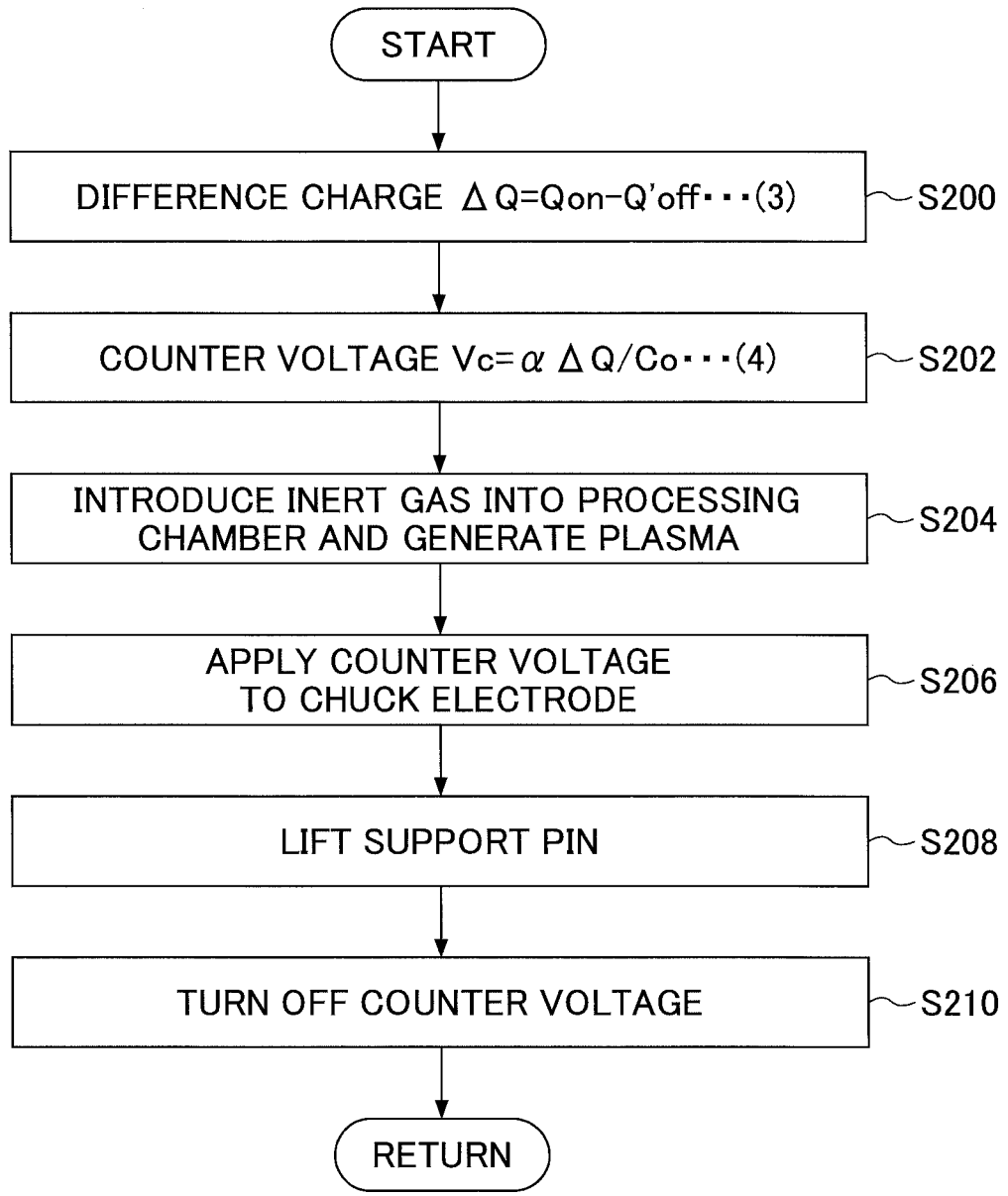
FIG. 6 is a flowchart illustrating process steps of a counter voltage process according to an embodiment of the preset invention.

Note that the above steps S108 and S109 correspond to process steps executed in a general discharge process. FIG. 6 described below illustrates process steps of a discharge process using a counter voltage according to the present embodiment. Also, the predetermined time period for measuring the current and acquiring the time-integration value Q'off of the current is described below.

FIG. 6 is a flowchart illustrating a counter voltage process according to the present embodiment. When the counter voltage process is started, the time-integration value Q'off of the current flowing from the chuck electrode 40a calculated in step S107 and the time-integration value Qon of the current when no residual charge is present stored in the storage unit 120 are applied to the above formula (3) to calculate the difference charge $\Delta Q$ charged to the chuck electrode 40a by the residual charge (step S200).

Then, the difference charge $\Delta Q$ calculated in step S200, the capacitance Co between the wafer W and the chuck electrode 40a stored in the storage unit 120, and the correlation between the difference charge $\Delta Q$ and the counter voltage $V_c$ (constant $\alpha$) are applied to the above formula (4) to calculate the counter voltage $V_c$ (step S202).

Figure 7:
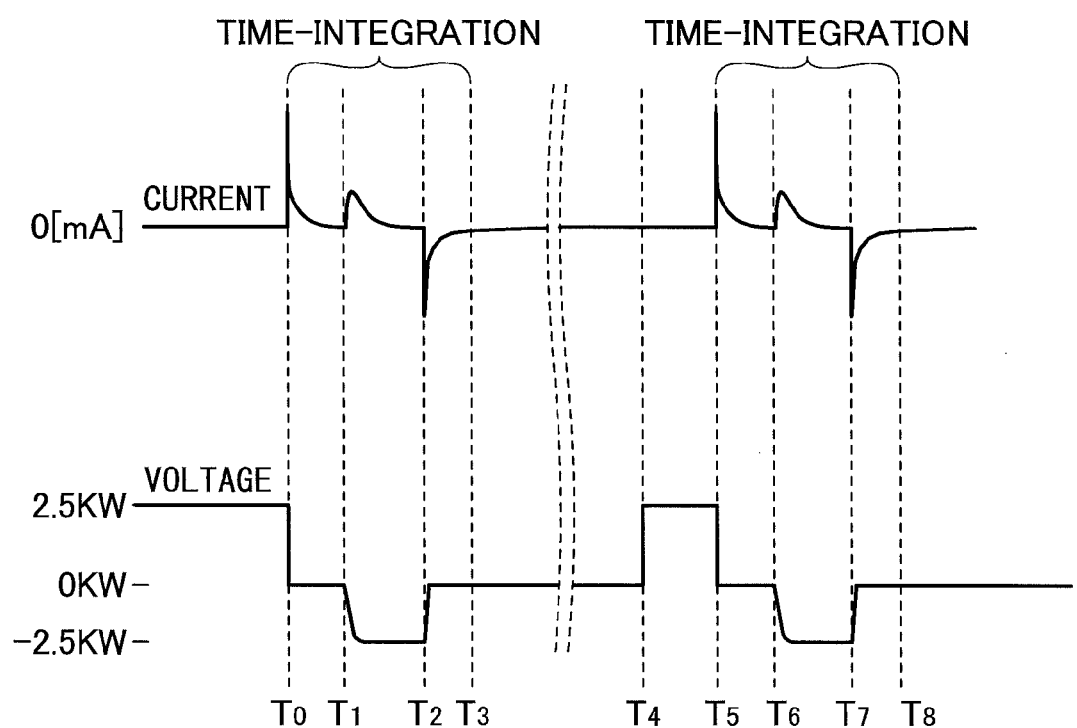
FIG. 7 is a graph illustrating a voltage from a DC voltage supply and a current flowing from a chuck electrode.

For example, a waveform illustrated at the upper side of FIG. 7 represents the waveform of a current that flows to the ammeter 45, and a waveform illustrated at the lower side of FIG. 7 represents corresponding on/off voltage values of the chuck electrode 40a. According to the waveform of the current at the upper side of FIG. 7, the voltage from the DC voltage supply 42 applied to the chuck electrode 40a is turned off at time $T_0$. Immediately thereafter, the ammeter 45 detects a first current peak. At time $T_1$, the opposite polarity voltage is supplied from the DC voltage supply 42 and applied to the chuck electrode 40a. At this time, the ammeter 45 detects a second current peak. At time $T_2$, the opposite polarity voltage that is supplied from the DC voltage supply 42 and applied to the chuck electrode 40a is turned off. At this time, the ammeter 45 detects a third current peak.

Time $T_3$ corresponds to a given time point after the opposite polarity voltage is turned off at time $T_2$. The time-integration value Q'off of the current flowing from the chuck electrode 40a may be acquired by measuring, for a predetermined time period from time $T_0$ to time $T_1$, a time-integration value of the current that flows after a plasma process is ended and the voltage applied to the chuck electrode 40a is turned off (time $T_0$). Alternatively, the time-integration value Q'off of the current flowing from the chuck electrode 40a may be acquired by measuring, for a predetermined time period from time $T_2$ to time $T_3$, a time-integration value of the current that flows when the opposite polarity voltage is turned off (time $T_2$). The predetermined time period during which the current is measured for acquiring the time-integration value Q'off of the current may be selected from a time range until the first current peak or the third current peak is reduced by approximately 20-80%. In the present embodiment, the time-integration value Q'off of the current is acquired by measuring the time-integration value of the current flowing for at least the predetermined time period from time $T_0$ to time $T_1$ or at least the predetermined time period from time $T_2$ to time $T_3$. For example, the predetermined time period producing a more favorable correlation between the difference charge $\Delta Q$ and the counter voltage $V_c$ may be used.

Referring to the waveform at the lower side of FIG. 7, a voltage from the DC voltage supply 42 is applied to the chuck electrode 40a once again when a plasma process is performed on a next wafer W (time $T_4$), and the voltage applied to the chuck electrode 40a is turned off after the plasma process (time $T_5$). The time-integration value Q'off of the current is acquired once again using the ammeter 45 to measure the time-integration value of the current flowing for a predetermined time period selected from time $T_5$ to time $T_6$. In this way, the time-integration value Q'off of the current is measured with respect to each wafer W, and feedback control of the counter voltage is repetitively performed based on the measurement result as described below.

After the counter voltage $V_c$ is calculated in step S202, gas is introduced into the processing chamber 10 to generate plasma (step S204), and the counter voltage $V_c$ is applied to the chuck electrode 40a (step S206). In this way, the electric charge of the electrostatic chuck 40 surface may be controlled to be zero and the residual attraction force between the wafer W and the electrostatic chuck 40 surface may be reduced to zero so that the wafer W may be de-chucked from the electrostatic chuck 40.

Then, the support pins 81 for supporting the wafer W placed on the electrostatic chuck 40 are raised (step S208), and the counter voltage is turned off (step S210). In this way, the counter voltage process of the present embodiment may be completed.

As described above, in the de-chuck control method according to the present embodiment, after a plasma process is completed, a discharge process is performed, and a counter voltage process is performed thereafter. In this way, the wafer W may be de-chucked from the electrostatic chuck 40.

When de-chucking the wafer W from the electrostatic chuck 40 by feedback controlling the voltage of the DC voltage supply 42, the time consumed for such feedback control operation is approximately 1 second. Thus, executing the counter voltage process according to the present embodiment may not raise substantial concerns over possible degradation of throughput. Also, the wafer W may be de-chucked from the electrostatic chuck 40 even in an emergency case where the wafer W cannot be de-chucked due to the residual charge despite performing the discharge process of applying the opposite polarity voltage, for example. Further, in the de-chuck control method according to the present embodiment, the electrical attraction force of the voltage to be generated may be determined before lifting the wafer W using the support pins 81, and thus, the risk of damaging the wafer W may be reduced.

Note that in the present embodiment, the wafer W is de-chucked by executing the counter voltage process and feedback control of the counter voltage regardless of the calculated value of the counter voltage. However, in some embodiments, an abnormality may be detected when the calculated counter voltage exceeds a predetermined threshold value, and operation of the plasma processing apparatus 1 may be stopped, for example.

Also, note that in the present embodiment, upon turning on (applying) the counter voltage, gas is introduced into the processing chamber 10 to generate plasma. In this case, the gas introduced into the processing chamber 10 is preferably an inert gas. Also, in some embodiments, instead of or in addition to generating plasma, DC discharge may be prompted.

Control Device Operations

Modified Embodiment

In the embodiment described above, feedback control is unconditionally performed in the counter voltage process with respect to every wafer W. However in some embodiments, the counter voltage process may be performed in a case where a start condition is satisfied, and the counter voltage process may not be performed when the start condition is not satisfied.

Figure 8:
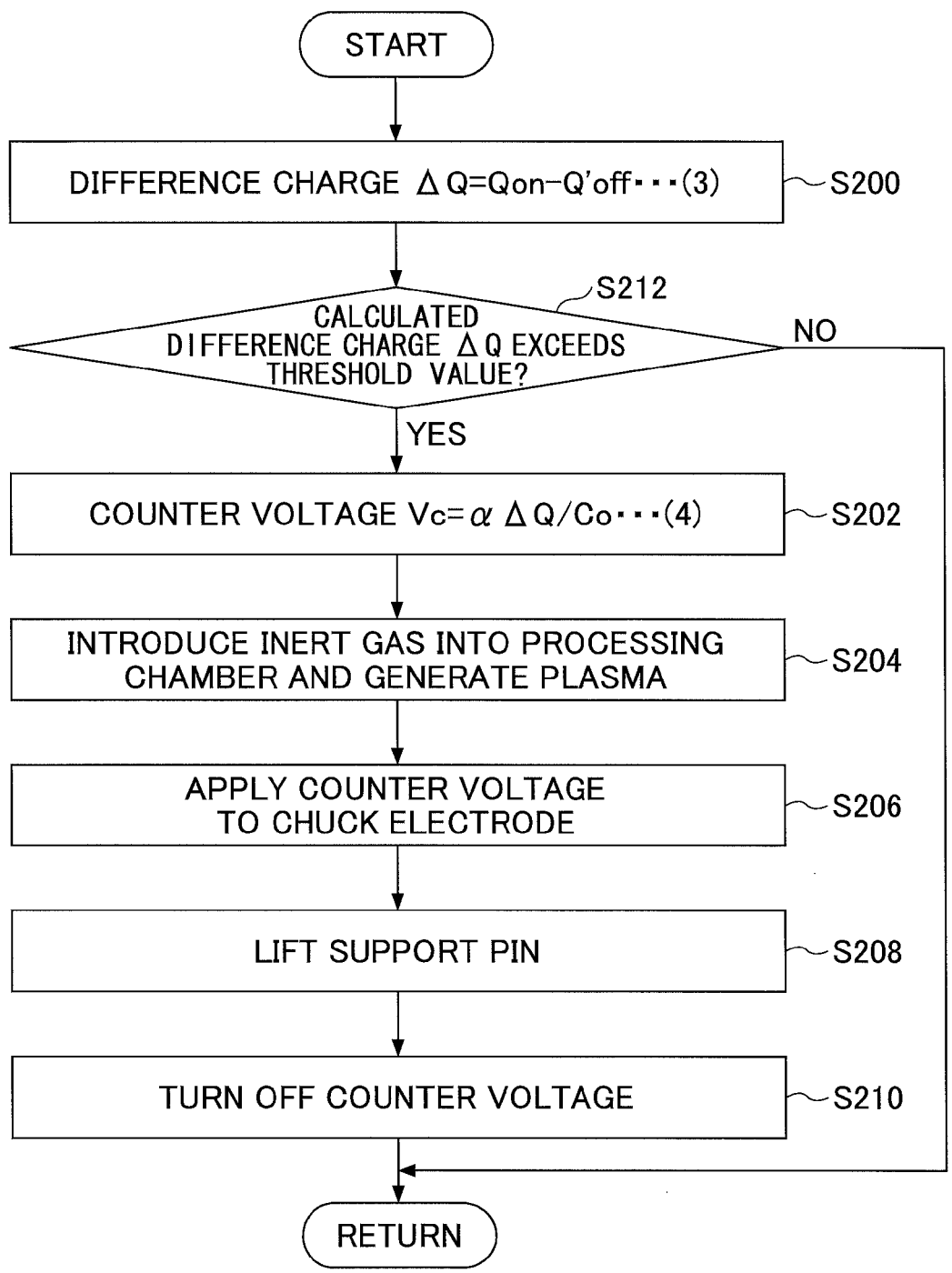
FIG. 8 is a flowchart illustrating process steps of a counter voltage process according to a modified embodiment.

FIG. 8 illustrates process steps of a counter voltage process according to a modification of the above embodiment. In the counter voltage process illustrated in FIG. 8, step S212 is added to the counter voltage process illustrated in FIG. 6. In step S212, a determination process is performed relating to a start condition of the counter voltage process. Note that other process steps of FIG. 8 are identical to those of FIG. 6.

That is, in the counter voltage process according to the present modified embodiment, after calculating the difference charge $\Delta Q$ by executing step S200, the process moves to step S212 where a determination is made as to whether the calculated difference charge $\Delta Q$ exceeds a predetermined threshold value. When it is determined that the difference charge $\Delta Q$ exceeds the threshold value, process steps for calculating the counter voltage $V_c$ and applying the calculated counter voltage $V_c$ to the chuck electrode 40*a* are performed (steps S202-S210). When it is determined that the difference charge $\Delta Q$ is less than or equal to the threshold value, the process is ended without applying a counter voltage to the chuck electrode 40*a*.

According to the present modified embodiment, in the case where the difference charge $\Delta Q$ exceeds the threshold value, it may be determined that the wafer W cannot be easily de-chucked due to the residual attraction force acting on the wafer W, and a discharge process using the counter voltage needs to be performed. On the other hand, in the case where the difference charge $\Delta Q$ is less than or equal to the threshold value, it may be determined that the residual attraction force is not so strong and the discharge process using the counter voltage need not be performed.

That is, step S212 corresponds to a start condition of the counter voltage process. For example, the counter voltage process may not be performed after the electrostatic chuck 40 surface is cleaned by a waferless cleaning process so that the start condition is no longer satisfied. In the present modified embodiment, the counter voltage process is not started until the electrostatic chuck 40 surface is altered and the insulating film 41*a* grows to a predetermined thickness. Once the insulating film 41*a* reaches the predetermined thickness, the counter voltage process may be automatically started. In this way, unnecessary process operations may be omitted and energy resources may be conserved.

Note that the determination of step S212 relating to whether the time-integration value of a current exceeds a predetermined threshold value may be executed in wafer units (in units of a predetermined number of the workpieces to be processed) as in the above modified embodiment, or in lot units, for example.

According to certain aspects of the de-chuck control methods of the present embodiment and the modified embodiment, by controlling the counter voltage supplied from the DC voltage supply, the wafer W may be easily de-chucked from the electrostatic chuck 40. In this way, even when it becomes increasingly difficult to de-chuck the wafer W from the electrostatic chuck 40 due to the alteration of the electrostatic chuck 40 surface, a time may be extended before an error occurs as a result of a failure to de-chuck the wafer W. In turn, wafer loss may be reduced and the apparatus operation rate may be increased, for example.

Although illustrative embodiments of a de-chuck control method and a control device for a plasma processing apparatus according to the present invention have been described above with reference to the accompanying drawings, the present invention is not limited to these embodiments. That is, numerous variations and modifications will readily occur to those skilled in the art, and the present invention includes all such variations and modifications that may be made without departing from the scope of the present invention.

Figure 9:
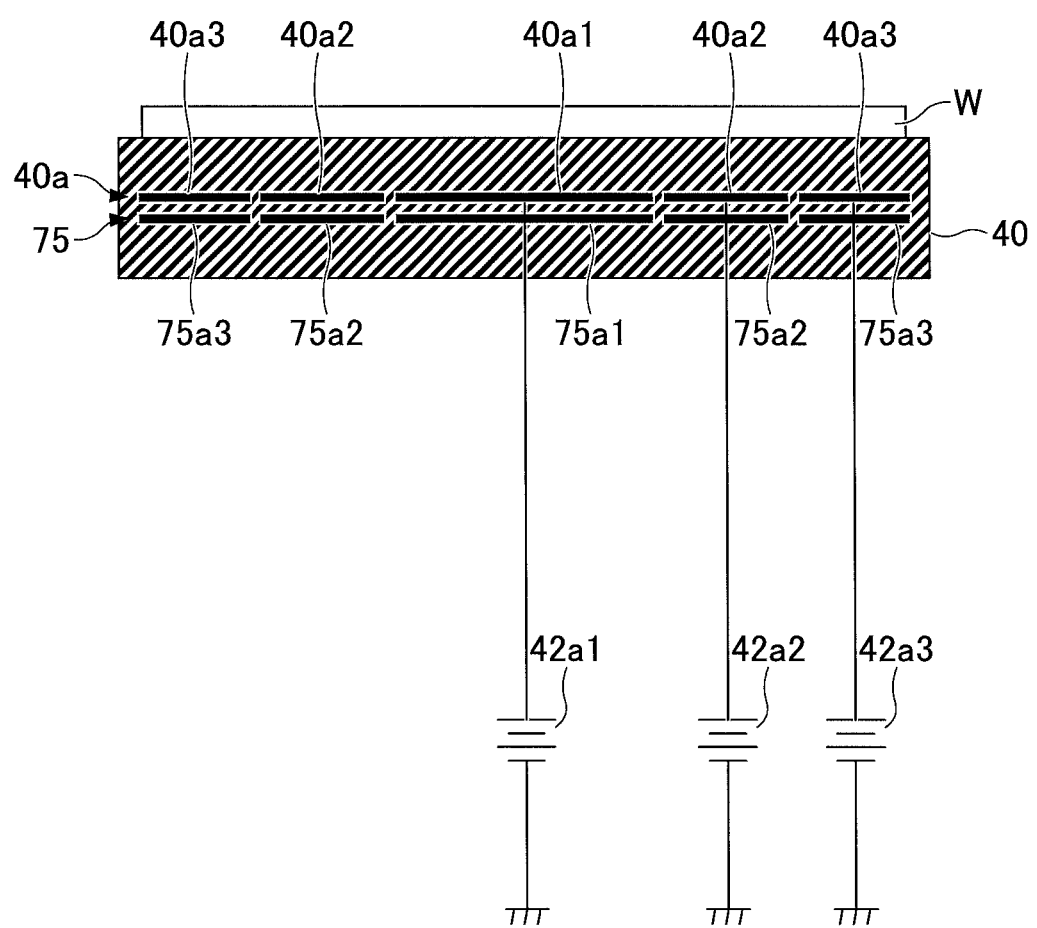
FIG. 9 illustrates a plasma processing apparatus having a heater divided into multiple zones according to a modified embodiment.

For example, as illustrated in FIG. 9, a plasma processing apparatus according to a modified embodiment of the present invention may have the heater 75 divided into at least three zones, and the chuck electrode 40*a* divided according to the divided zones of the heater 75. The heater 75 may be arranged within the electrostatic chuck 40 or near the electrostatic chuck 40. In FIG. 9, the heater 75 is embedded in the electrostatic chuck 40. The heater 75 is divided into a center zone 75*a*1, a middle zone 75*a*2 arranged concentrically around the outer periphery of the center zone 75*a*1, and an edge zone 75*a*3 arranged at the outermost periphery. In accordance with the divided zones of the heater 75, the chuck electrode 40*a* is divided into a center chuck electrode 40*a*1, a middle chuck electrode 40*a*2, and an edge chuck electrode 40*a*3. The center chuck electrode 40*a*1, the middle chuck electrode 40*a*2, and the edge chuck electrode 40*a*3 are respectively connected to a DC voltage supply 42*a*1, a DC voltage supply 42*a*2, and a DC voltage supply 42*a*3.

In this way, a counter voltage $V_c$ may be calculated with respect to each of the zones corresponding to the center chuck electrode 40*a*1, the middle chuck electrode 40*a*2, and the edge chuck electrode 40*a*3. Accordingly, the counter voltage $V_c$ may be adjusted according to the residual charge of each zone of the electrostatic chuck 40. For example, in a case where a relatively large residual attraction force due to the residual charge is only present within the outermost edge zone region of the electrostatic chuck 40, a counter voltage may only be applied to the outermost edge zone region. In this way, even when the residual charge within a plane has an uneven distribution, the wafer W may be de-chucked from the electrostatic chuck 40 without causing cracks or damage to the wafer W.

Figure 10:
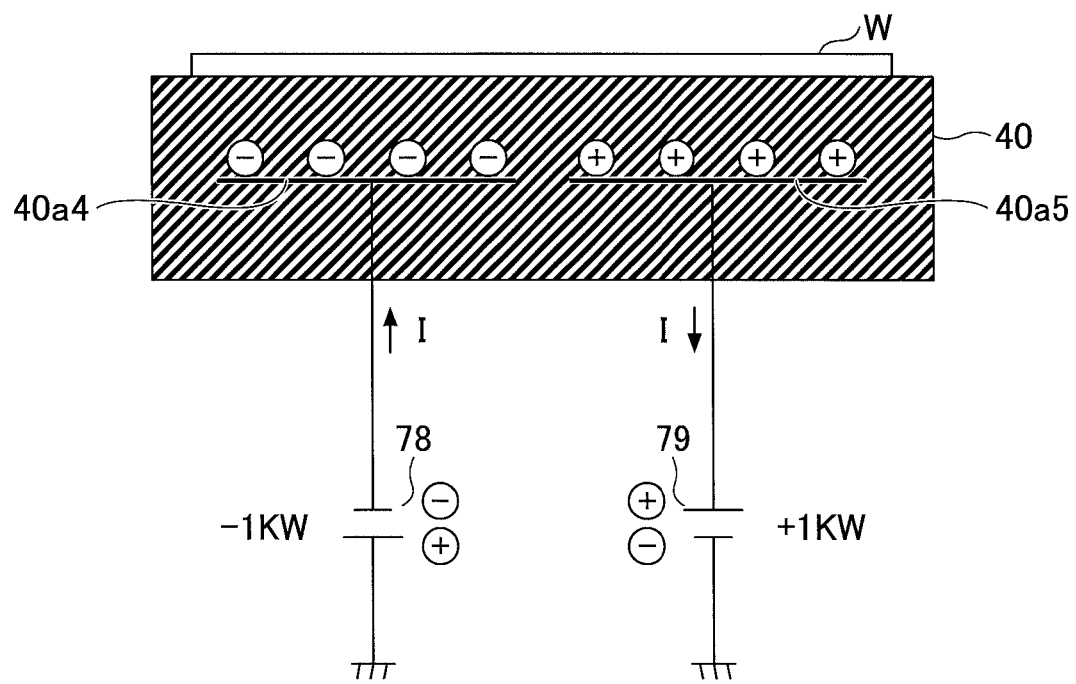
FIG. 10 illustrates a plasma processing apparatus having a twin electrode structure according to a modified embodiment.

Also, a plasma processing apparatus according to another modified embodiment of the present invention may have a twin electrode structure as illustrated in FIG. 10, for example. Referring to FIG. 10, the electrostatic chuck 40 includes twin chuck electrodes 40*a*4 and 40*a*5. That is, two identically-shaped sheets of electrodes are arranged within or on the surface of the electrostatic chuck 40. Electric charges of opposite polarities are charged to the twin chuck electrodes 40*a*4 and 40*a*5 by applying voltages of opposite polarities thereto. In the twin electrode structure, the voltages applied to the twin chuck electrodes 40a4 and 40a5 are normally relatively low. Accordingly, electrical damage to the wafer W may be reduced.

A DC voltage supply 78 and a DC voltage supply 79 are connected to the twin chuck electrodes 40a4 and 40a5, respectively. In this way, a counter voltage $V_c$ may be calculated with respect to each of the twin chuck electrodes 40a4 and 40a5. That is, the counter voltage $V_c$ may be adjusted according to the residual charge of each of the twin chuck electrodes 40a4 and 40a5 of the electrostatic chuck 40.

Note that although a plasma etching process is described above as an exemplary plasma process executed by the plasma processing apparatus, application of the present invention is not limited to a plasma processing apparatus that executes a plasma etching process but may also be applied to plasma processing apparatuses that execute other processes such as a plasma CVD (chemical vapor deposition) process for forming a film on a wafer, a plasma oxidation process, a plasma nitridation process, sputtering, and ashing, for example.

Also, note that the plasma processing apparatus of the present invention is not limited to a parallel-plate type etching apparatus that generates capacitively coupled plasma (CCP) by discharging a high frequency generated between parallel plate electrodes within a chamber. For example, the present invention may also be applied to an inductively coupled plasma (ICP) processing apparatus that has an antenna arranged near or on a top surface of a chamber and is configured to generate inductively coupled plasma under a high frequency induction field, and a microwave plasma processing apparatus, or some other type of plasma processing apparatus that generates plasma waves using microwave power, for example.

Also, the workpiece subject to a plasma process in the present invention is not limited to a semiconductor wafer but may be a large substrate for a flat panel display (FPD), an electroluminescence (EL) element, or a substrate for a solar battery, for example.

Further, in a de-chuck control method according to an embodiment of the present invention, the current measured for the predetermined time period may correspond to a current that flows immediately after the voltage applied to the chuck electrode is turned off.

Also, the current measured for the predetermined time period may correspond to a current that flows immediately after an opposite polarity voltage that is applied to the chuck electrode is turned off.

Also, the time-integration value of the current measured for the predetermined time period may be measured by an ammeter arranged between the chuck electrode and a DC voltage supply.

Also, the de-chuck control method may further include a step of determining whether the difference is greater than a predetermined threshold value, and the counter voltage may be applied to the chuck electrode when the difference is determined to be greater than the threshold value.

The determination of whether the difference is greater than the predetermined threshold value may be executed in lot units or in units of a predetermined number of the workpieces to be processed.

Also, a heater may be arranged within or near the electrostatic chuck, the heater may be divided into a plurality of zones, the chuck electrode and a DC voltage supply may be provided for each of the zones, and the counter voltage may be calculated for each of the chuck electrodes of each of the zones and applied to each of the chuck electrodes of each of the zones.

Also, the chuck electrode may be divided into twin electrodes, a DC voltage supply may be provided for each of the twin electrodes, and the counter voltage may be calculated for each of the twin electrodes and applied to each of the twin electrodes.

Also, the predetermined time period may be selected from a time range after the voltage applied to the chuck electrode is turned off until a peak of the current that flows from the chuck electrode reaches 20-80%.

The present application is based on and claims the benefit of priority of Japanese Patent Application No. 2012-021658 filed on Feb. 3, 2012, and U.S. Provisional Application No. 61/595,729 filed on Feb. 7, 2012, the entire contents of which are herein incorporated by reference.

DESCRIPTION OF THE REFERENCE NUMERALS 1 plasma processing apparatus
10 processing chamber
12 mounting table (lower electrode)
28 exhaust device
32 high frequency power supply
40 shower head (upper electrode)
40 electrostatic chuck
40a chuck electrode
41a insulating film
42 DC voltage supply
43 switch
44 ground part
45 ammeter
52 heat transfer gas supply source
62 gas supply source
71 chiller unit
75 heater
81 support pin
84 motor
100 control device
105 process execution unit
110 acquisition unit
115 control unit
120 storage unit
200 measuring device
202 ionizer
204 ammeter
206 surface electrometer

The invention claimed is:

1. A de-chuck control method for de-chucking a workpiece from an electrostatic chuck, which includes a chuck electrode and is configured to electrostatically attract the workpiece, the de-chuck control method comprising the steps of:

acquiring a time-integration value of a current based on a result of measuring the current flowing from the chuck electrode for a predetermined time period after a plasma process on the workpiece is ended and a voltage applied to the chuck electrode during the plasma process is turned off;

calculating a difference between the acquired time-integration value of the current and a predetermined electric charge that is charged to the chuck electrode when the voltage is applied to the chuck electrode during the plasma process;

calculating a counter voltage according to a residual charge of the electrostatic chuck based on the calculated difference;

applying the counter voltage to the chuck electrode;

raising a support pin for supporting the workpiece and de-chucking the workpiece from the electrostatic chuck after the counter voltage is applied to the chuck electrode, and turning off the counter voltage, and determining whether the calculated difference is greater than a predetermined threshold value;

wherein the counter voltage is applied to the chuck electrode when the calculated difference is determined to be greater than the threshold value.

2. The de-chuck control method as claimed in claim 1, wherein the current measured for the predetermined time period corresponds to a current that flows immediately after the voltage applied to the chuck electrode is turned off.

3. The de-chuck control method as claimed in claim 1, wherein the current measured for the predetermined time period corresponds to a current that flows immediately after an opposite polarity voltage that is applied to the chuck electrode is turned off.

4. The de-chuck control method as claimed in claim 1, wherein the time-integration value of the current measured for the predetermined time period is measured by an ammeter arranged between the chuck electrode and a DC voltage supply.

5. The de-chuck control method as claimed in claim 1, wherein the determination of whether the difference is greater than the predetermined threshold value is executed in lot units or in units of a predetermined number of workpieces to be processed.

6. The de-chuck control method as claimed in claim 1, wherein
  a heater is arranged within or near the electrostatic chuck;
  the heater is divided into a plurality of zones;
  the chuck electrode and a DC voltage supply are provided for each of the zones; and
  the counter voltage is calculated for each of the chuck electrodes of each of the zones and applied to each of the chuck electrodes of each of the zones.

7. The de-chuck control method as claimed in claim 1, wherein
  the chuck electrode is divided into twin electrodes;
  a DC voltage supply is provided for each of the twin electrodes; and
  the counter voltage is calculated for each of the twin electrodes and applied to each of the twin electrodes.

8. The de-chuck control method as claimed in claim 1, wherein the predetermined time period is selected from a time range after the voltage applied to the chuck electrode is turned off until a peak of the current that flows from the chuck electrode reaches 20-80%.

9. A control device for a plasma processing apparatus including an electrostatic chuck, which includes a chuck electrode and is configured to electrostatically attract a workpiece, the control device comprising:
  an acquisition unit configured to acquire a time-integration value of a current based on a result of measuring for a predetermined time period the current that flows from the electrostatic chuck after a plasma process on the workpiece is ended and a voltage applied to the workpiece during the plasma process is turned off; and
  a control unit configured to calculate a difference between the acquired time-integration value of the current and a predetermined electric charge that is charged to the electrostatic chuck when the voltage is applied to the chuck electrode during the plasma process, calculate a counter voltage according to a residual charge of the electrostatic chuck based on the calculated difference, apply the counter voltage to the chuck electrode, raise a support pin for supporting the workpiece and de-chuck the workpiece from the electrostatic chuck after the counter voltage is applied to the chuck electrode, and turn off the counter voltage,
  wherein the control unit if further configured to determine whether the calculated difference is greater than a predetermined threshold value, and
  wherein the counter voltage is applied to the chuck electrode when the calculated difference is determined to be greater than the threshold value.

* * * * *